March 31, 1959 L. A. GLYNN 2,880,313
CRYSTAL OSCILLATOR ISOLATION MEANS
Filed Aug. 28, 1957
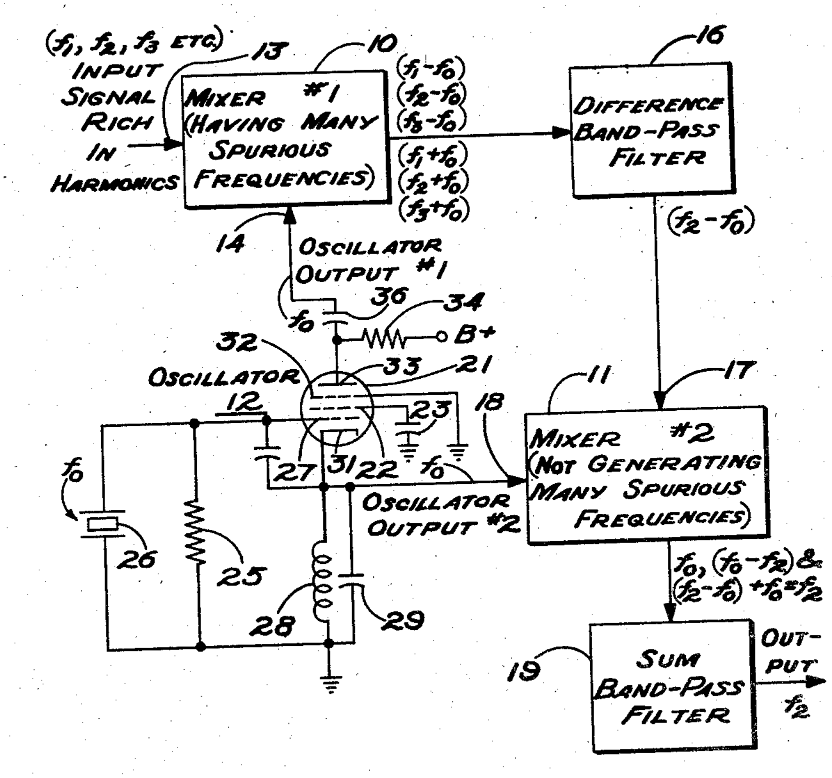
INVENTOR.
LEON A. GLYNN
BY Moody and Goldman
ATTORNEYS United States Patent Office 2,880,313

Patented Mar. 31, 1959

2,880,313

CRYSTAL OSCILLATOR ISOLATION MEANS

Leon A. Glynn, Cedar Rapids, Iowa, assignor to Collins Radio Company, Cedar Rapids, Iowa, a corporation of Iowa Application August 28, 1957, Serial No. 680,707

1 Claim. (Cl. 250—20)

This invention relates to isolation means between inputs to a pair of frequency mixers that receive the output frequency of a common oscillator.

In the past, electronic circuits often have used frequency mixers fed from a common oscillator. Such mixers were connected generally to the same output electrode of the oscillator, such as its plate, with resistors or a buffer amplifier provided as isolation. Without isolation a direct feed-through was provided which could not be tolerated because of coupling of spurious products from one of the mixers to the other. Resistor isolation has the disadvantage of attenuating the oscillator signal along with the spurious products. The buffer amplifier was a more satisfactory conventional solution, but it required an additional tube and more circuitry.

The invention obtains the advantage of a buffer amplifier without requiring an extra tube or circuitry and does not have the losses associated with resistor isolation. The present invention teaches how isolation between the mixer inputs can be obtained by the technique of connecting them to a particular type of oscillator circuit.

The oscillator circuit, utilized in the combination of the invention, has a tube having at least a screen grid, wherein the frequency-controlling element is connected between the cathode and control grid. A first mixer which generates the largest amount of spurious frequency content has an input connected to the plate of the oscillator tube. A second mixer has an input connected to the cathode of the oscillator tube. Spurious frequencies generated in the first mixer are isolated thereby from the second mixer.

Further objects, features and advantages of this invention will be apparent to a person skilled in the art upon further study of the specification and the accompanying drawings, in which the single figure illustrates a form of the invention.

Now referring to the drawing for a more detailed disclosure, the figure shows the invention included in a drift-canceling-harmonic-selection system, which selects one of a plurality of closely-spaced harmonically-related frequencies. For example, the input signal may have the closely-spaced harmonically-related frequencies represented by $f_1$, $f_2$, $f_3$, etc. These frequencies might be 454, 455, 456, etc. kilocycles. The over-all system in the figure permits a selection of a chosen one of these harmonics.

The harmonic-selection system utilizes first and second mixers 10 and 11, which receive a common heterodyning frequency from an oscillator 12. First mixer 10 receives the harmonic frequencies $f_1$, $f_2$, $f_3$, etc. at one input 13 and receives at a second input 14 a signal from oscillator 12. The oscillator frequency $f_0$ is preferably of the same order as the harmonic frequencies and heterodynes the harmonic frequencies to a low frequency level $(f_1-f_0, f_2-f_0, f_3-f_0)$, where the incremental frequency difference between the frequencies becomes a high percentage of their absolute value. Then, a desired one of the heterodyned harmonics is easily selected by a relatively low Q filter 16, which is tuned to the frequency $(f_2-f_0)$. It will highly attenuate the unselected frequencies $(f_1-f_0)$ and $(f_3-f_0)$.

Second mixer 11 therefore receives at an input 17 the output frequency of filter 16, which is $(f_2-f_0)$. Another input 18 of mixer 11 also is connected to oscillator 12 to receive its frequency $f_0$. The sum of the mixer input frequencies $(f_2-f_0)+f_0$, which is equal to harmonic frequency $f_2$, is selected by filter 19. Thus, it is seen that the oscillator frequency $f_0$ is canceled out of the output of sum filter 19. Thus, harmonic frequency $f_2$ is selected and is the output frequency of the system without its previously accompanying harmonics.

Due to the close harmonic spectrum generally provided to first mixer 10, it generates a large number of closely-spaced spurious frequencies, some of which are unavoidably provided to its input terminal 14. It is essential that these spurious frequencies not pass from terminal 14 through oscillator 12 to input 18 of second mixer 11; because if frequencies $f_1$ and $f_3$ so passed, they would appear at the output of the system and there would be no segregation of harmonic frequency $f_2$.

This invention teaches an oscillator arrangement in combination with the mixers which provides isolation from terminal 14 of mixer 10 to terminal 18 of mixer 11. This is done by utilizing an oscillator tube 21 that includes a screen grid 22 which is maintained at ground potential radio-frequency-wise. It is conventionally connected to ground through a capacitor 23.

Oscillator 12 is a crystal oscillator having a crystal 26 connected between ground and the control grid 27 of tube 21. A resistor 25 is connected across crystal 26; and an L–C circuit, comprising an inductance 28 and a capacitance 29, is connected between ground and the cathode 31 of tube 21 to provide oscillation feedback. Tube 21 is a pentode and its suppressor grid 32 is connected to ground. The plate 33 of tube 21 is connected to a B plus power supply voltage through a load resistor 34.

Input 14 of mixer 10 is connected to the plate of oscillator tube 21 through a blocking capacitor 36. On the other hand, input 18 of second mixer 11 is connected to cathode 31 of the oscillator tube 21.

The type of crystal oscillator illustrated is well-known but the manner of its connections to the mixers enables a novel type of isolation from terminal 14 to terminal 18. This isolation is primarily provided through the very high back impedance of tube 21 which can be of the order of a megohm. The resulting isolation does not cause signal attenuation or increase circuit complexity. Any spurious frequencies coming to the plate of tube 21 from terminal 14 face the radio-frequency ground of both screen grid 22 and suppressor grid 32, and accordingly is by-passed to ground so that it cannot reach second mixer 11.

Although this invention has been described with respect to a particular embodiment thereof, it is not to be so limited as changes and modifications may be made therein which are within the full intended scope of the invention as defined by the appended claim.

I claim:

Isolation means in a drift canceling harmonic frequency selection circuit comprising a first mixer having an input receiving said harmonic frequencies, a common crystal oscillator injecting a frequency into the other of said first mixer inputs, a difference filter having its input connected to the output of said first mixer for selecting a fixed heterodyne frequency of said first mixer, said oscillator including a tube having a cathode, plate, control grid, screen grid, and suppressor grid, means for grounding said screen grid and suppressor grid radio-frequency-wise, a frequency-controlling crystal connected between ground and the control grid of said oscillator tube, a parallel-resonant circuit being connected between ground and said cathode, the other input of said first mixer being coupled to the plate of said oscillator, a second frequency mixer having one input coupled to the output of said difference filter, and having another input coupled to said cathode, and a second filter connected to the output of said second mixer for selecting the heterodyne frequency which is the sum of the second mixer's input frequencies.

References Cited in the file of this patent

UNITED STATES PATENTS

| | | |
|---|---|---|
| 1,738,495 | Kolster | Dec. 3, 1929 |
| 2,297,451 | Bendel | Sept. 29, 1942 |
| 2,451,291 | Koch | Oct. 12, 1948 |
| 2,468,041 | Couillard | Apr. 26, 1949 |

OTHER REFERENCES

Article: "Three Oscillator Designs Standarize Circuitry," by Gruen. Electronics, Aug. 1, 1957, pages 177–179.